(12) United States Patent
Hsieh et al.

(10) Patent No.: US 7,968,431 B2
(45) Date of Patent: Jun. 28, 2011

(54) DIFFUSION REGION ROUTING FOR NARROW SCRIBE-LINE DEVICES

(75) Inventors: Ming-Chang Hsieh, Hsinchu County (TW); Hung-Lin Chen, Pingtung (JP); Hsiu-Mei Yu, Hsinchu (TW); Chin Kun Lan, Hsin Chu (TW); Dong-Lung Lee, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 420 days.

(21) Appl. No.: 12/173,121

(22) Filed: Jul. 15, 2008

(65) Prior Publication Data

US 2010/0013059 A1 Jan. 21, 2010

(51) Int. Cl.
*H01L 23/544* (2006.01)
(52) U.S. Cl. ........ 438/462; 38/113; 38/33; 257/E21.214
(58) Field of Classification Search ............... 438/462, 438/113, 114, 68, 33; 257/620, E23.179, 257/E21.214
See application file for complete search history.

(56) References Cited

U.S. PATENT DOCUMENTS 7,598,154 B2 * 10/2009 Izumi ........................... 438/462

* cited by examiner

*Primary Examiner* — Evan Pert
*Assistant Examiner* — Selim Ahmed
(74) *Attorney, Agent, or Firm* — Haynes and Boone, LLP

(57) ABSTRACT

The present disclosure provides a method of making an integrated circuit (IC) device. The method includes forming a first IC feature and a second IC feature in a semiconductor substrate, the first and second IC features being spaced from each other and separated by a scribe region; forming, in the semiconductor substrate, a doped routing feature at least partially within the scribe region and configured to connect the first and second IC features; forming a multilayer interconnect (MLI) structure and an interlayer dielectric (ILD) on the semiconductor substrate, wherein the MLI is configured to be absent within the scribe region; and etching the ILD and the semiconductor substrate within the scribe region to form a scribe-line trench.

18 Claims, 2 Drawing Sheets

DIFFUSION REGION ROUTING FOR NARROW SCRIBE-LINE DEVICES

BACKGROUND

This invention relates to the singularizing process of dies, more specifically, to parallel chip probe (CP) test products using a scribe line etch to singularize the dies.

Die sawing is used to singularize dies. However, die sawing becomes unfeasible for products with scribe lines of 60 microns or less. When an etching process is applied to the scribe lines for separating dies, the metal routing in the scribe lines requires expensive and complex photolithography and etching processes. Various problems associated with the scribe line etching process include seal ring damage, copper etching, and corrosion of the exposed copper. Therefore, what is needed is an integrated circuit (IC) structure and method to etch scribe lines addressing the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
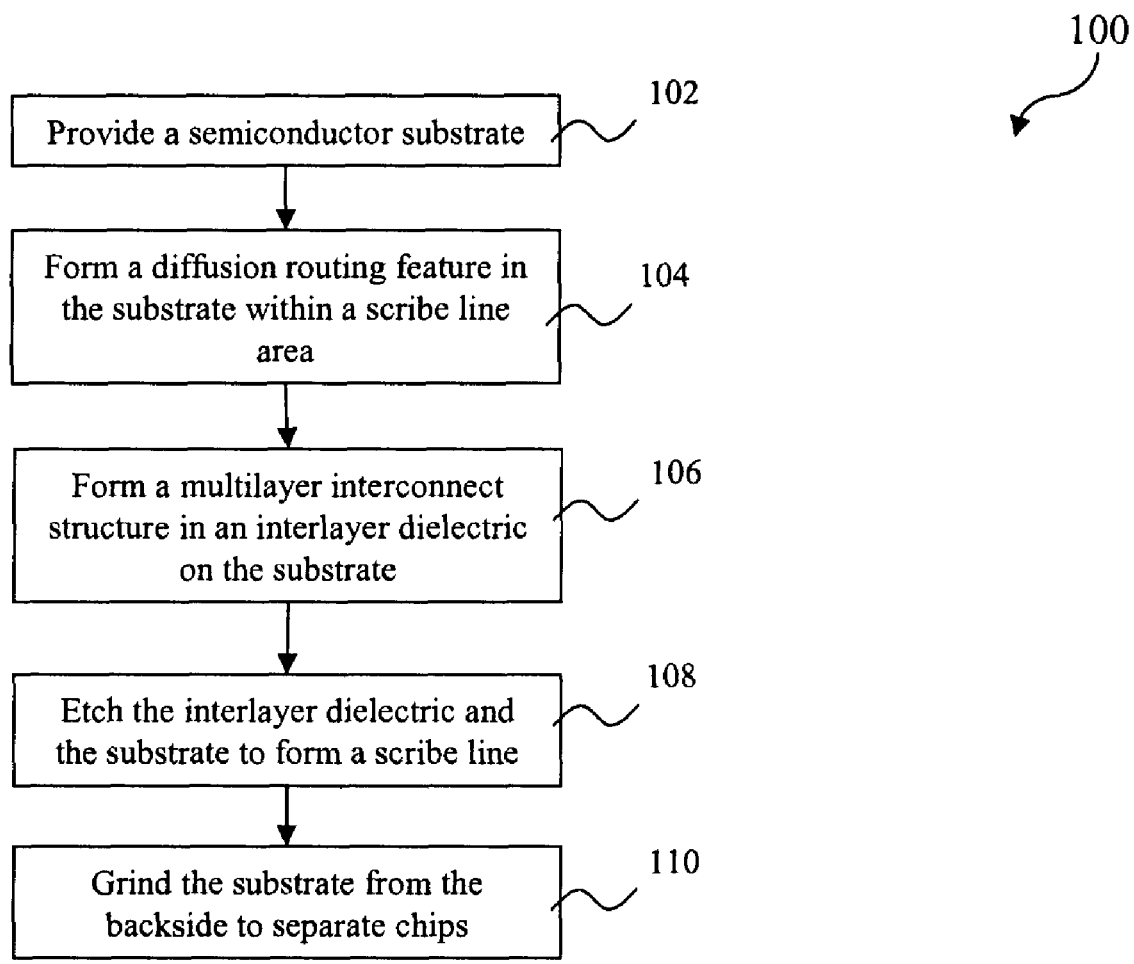
FIG. 1 is a flowchart of a method to etch the scribe lines in one embodiment constructed according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present invention provides a method and a scribe line structure for integrated circuit devices that improves on one or more of the problems identified above. In various embodiments, interconnect features in the scribe lines are utilized by doped silicon features (or diffusion regions). The metal interconnect structure is eliminated in the scribe lines, and the overall reliability and quality of the devices, and manufacturing efficiency, are significantly improved.

For the sake of example, an example device will be shown to progress through a series of processing operations to illustrate various embodiments of the present invention. It is understood that several processing steps may be only briefly described, such steps being well known to those of ordinary skill in the art. Also, additional processing steps can be added, and certain of the following processing steps can be removed and/or changed while still implementing the claimed invention. Thus, the following description should be understood to represent examples only and is not intended to suggest that one or more steps are required.

Figure 2:
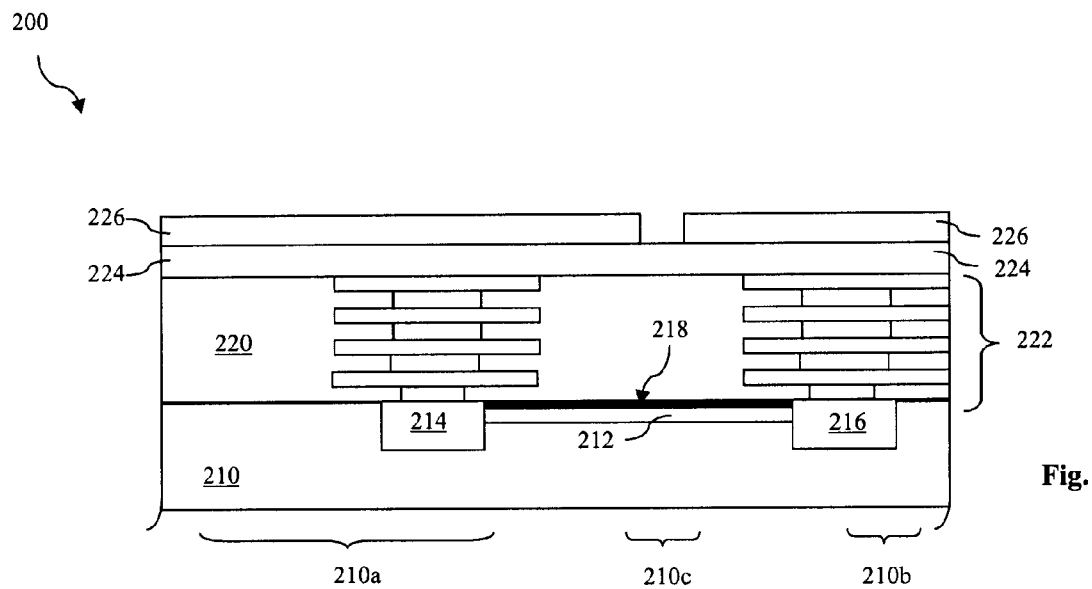
FIGS. 2-3 are cross sectional views of an integrated circuit (IC) device during various processing stages, constructed according to one or more embodiments of the present invention.
Figure 3:
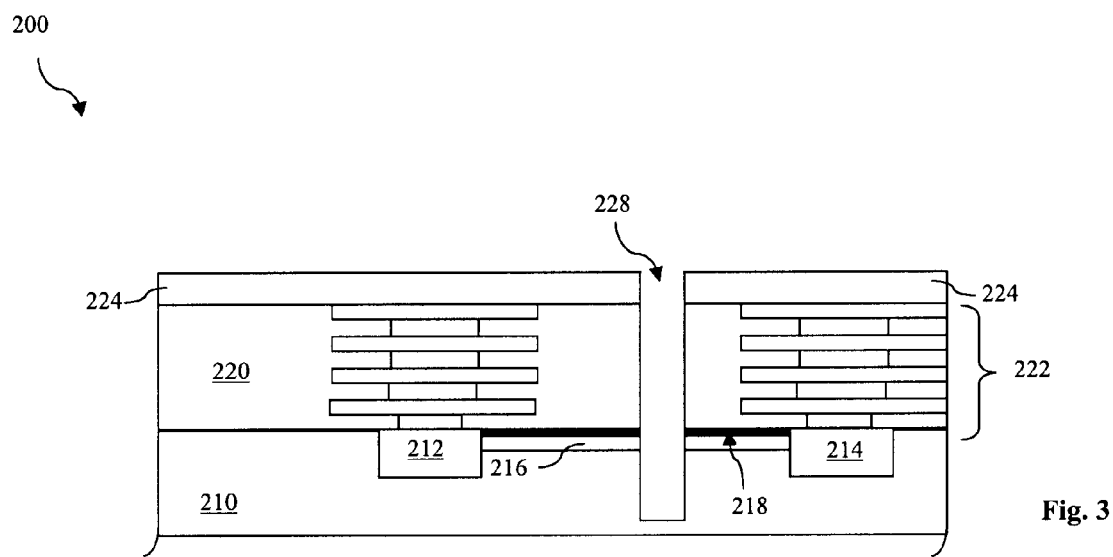

FIG. 1 is a flowchart of a method 100 of manufacturing integrated circuit dies in one embodiment. FIGS. 2 and 3 are sectional views of an integrated circuit device 200 during different fabrication stages, constructed according to various embodiments of the present disclosure. With reference to FIGS. 1 through 3, the method 100 and the integrated circuit 200 are collectively described.

Referring to FIGS. 1 and 2, the method 100 begins at step 102 by providing a semiconductor substrate 210 of the integrated circuit device 200. The substrate 210, according to the present embodiment, is a silicon substrate. The substrate 210 may alternatively or additionally include other elementary semiconductors such as germanium. The substrate 210 may also include a compound semiconductor, such as silicon carbide, gallium arsenic, indium arsenide, and indium phosphide.

The substrate 210 includes a plurality of IC cell areas, such as 210a and 210b, separated by scribe lines such as 210c. Each cell area is designed for an integrated circuit to be formed thereon. The cell areas are separated at the scribe lines into dies (chips). Each cell area includes a seal ring (not shown) configured to embrace the integrated circuit in that cell area. The seal ring includes metal, such as copper, to seal the integrated circuit from moisture and other impacts from the outside environment after the die is singularized from the substrate. The substrate 210 includes various doped wells and other doped features configured and coupled to form various microelectronic devices, such as metal-insulator-semiconductor field effect transistors (MOSFET) including complementary MOSFETs (CMOS). Additionally or alternatively, the substrate 210 includes micro-electro-mechanical systems (MEMS), CMOS imaging sensors (CIS), and/or other suitable active and/or passive devices. The doped wells and other doped features include p-type doped regions and/or n-type doped regions formed by a doping process such as ion implantation. Other structures such as gate dielectrics and polysilicon gate electrodes may be additionally formed on the substrate for devices such as CMOS transistors. The substrate 210 also includes various isolation features configured to separate various devices from each other for electrical isolation. The isolation features may include different structures and can be formed by a particular processing technology. In one example, the isolation features include dielectric isolation such as shallow trench isolation (STI). The STI can be fabricated by etching the substrate to form a trench and filling the trench with one or more dielectric material layers.

The method 100 includes a step 104 to form one or more doped routing features (diffusion routing feature) 212 in the scribe line 210c. The diffusion routing feature is a doped semiconductor region (such as a doped silicon feature) with effective electrical connection, formed in the semiconductor substrate. The diffusion routing feature 212 is configured to couple two IC devices. In one example, the diffusion routing feature is configured to connect a device in a first IC cell area to a test vehicle. The test vehicle can be formed in a second IC cell area. Alternatively, the test vehicle is formed in an open region between the scribe line and the second IC cell area.

The diffusion routing feature 212 is configured to contact two separate device features, such as doped features 214 and 216. In one example, the doped feature 214 is a portion of the device in the first IC cell area, and the doped feature 216 is a portion of the test vehicle. In another example, at least one of the doped features 214 and 216 is a source/drain region of the associated CMOS transistor.

In various embodiments, the doped routing feature 212 includes a N-type dopant or P-type dopant formed by ion implantation. For example, the doped routing feature 212 includes boron (B), phosphorus (P), or other suitable dopants. In furtherance of the example, boron dopant is incorporated into the silicon substrate to form the routing feature 212 by an ion implantation. The ion implantation utilizes an implantation energy ranging between about 10 keV and about 100 keV in one embodiment. The ion implantation utilizes an implantation dose ranging between about $10^{13}/cm^3$ and about $10^{17}/cm^3$ in another embodiment. Alternatively, phosphorus dopant is incorporated into the silicon substrate to form the routing feature 212 by an ion implantation. The ion implantation utilizes an implantation energy ranging between about 20 keV and about 200 keV and/or an implantation dose ranging between about $10^{13}/cm^3$ and about $10^{17}/cm^3$. The doped routing feature 212 can be formed by a dedicated ion implantation process. Alternatively, the doped routing feature 212 can be formed with other device features by one ion implantation process. For example, the doped routing feature 212 can be formed with source/drain regions in one ion implantation process. In another example, the doped routing feature 212 can be formed with doped features 214 and 216 in one ion implantation process.

In another embodiment, as illustrated in FIG. 2, an additional silicide layer 218 may be disposed on the doped silicon routing feature 212 for enhanced electrical conduction. The metal silicide layer 218 may include nickel silicide, cobalt silicide, or titanium silicide. In another embodiment, the metal silicide layer 218 may include tungsten silicide, tantalum silicide, platinum silicide, erbium silicide, palladium silicide, or combinations thereof. The metal silicide layer 218 may be formed by a self-aligned silicide (salicide) process. During the salicide process, a metal layer is deposited on the silicon substrate. The silicon substrate is then annealed such that the deposited metal reacts with the silicon to form silicide; and thereafter, an etching process is applied to remove the unreacted metal, leaving the silicide aligned with silicon regions. The second annealing process may be further applied to the substrate to transfer the silicide into a higher conductive phase. The silicide feature 218 overlying the doped routing feature 212 in the scribe line can be formed with other silicide features, such as gate silicide and source/drain silicide features by one silicidation process.

Still referring to FIGS. 1 and 2, the method 100 proceeds to step 106 where one or more metal layers 222 (or interconnect) and isolation dielectrics 220 (collectively referred to as metallization) are formed above the substrate 210. In the present embodiment, the interconnect 222 includes copper. As illustrated in FIG. 2, the interconnect 222 includes horizontal metal lines and vertical metal features (vias and contacts). However, the metal interconnect is not configured in the scribe line. Any necessary interconnection across the scribe line is utilized by one or more doped routing features and/or silicide features properly configured. Therefore, the interconnect within the scribe line region 210c is free of any metal interconnect feature.

In one embodiment, a copper damascene process is performed to form the metal interconnect structure. In the present embodiment, various trenches are formed in the isolation dielectrics. A copper seed layer is formed in the trenches by a physical vapor deposition (PVD). Then, copper fills in the trenches by plating and is polished to provide a patterned copper layer. In one example, the polishing is a chemical-mechanical polish (CMP). The copper damascene process may be implemented more than once to form multi-layer interconnects. The isolation dielectrics 220 include silicon oxide. In another embodiment, the isolation dielectrics 220 include other suitable dielectric materials such as a low k dielectric material.

The integrated circuit 200 further includes a passivation layer 224 disposed on the metallization. In one example, the passivation layer includes a first passivation film formed on the metallization. In another example, the passivation layer 224 further includes a second passivation film formed on the first passivation film. The first and second passivation films each may include various suitable passivation materials. In one example, the first passivation film includes silicon oxide, and the second passivation film includes silicon nitride.

Referring to FIGS. 1, 2, and 3, the method 100 proceeds to step 108 by etching the isolation dielectric 220 and the silicon substrate 210 to form a scribe line trench 228. At step 108, the scribe line trench can be formed by a conventional lithography patterning method utilizing a lithography process and an etching process. For example, a photoresist layer 226 is coated on the integrated circuit 200 by a proper method such as spin-coating. The photoresist layer 226 is further patterned to have one or more openings defining the scribe line 210c, as illustrated in FIG. 2. In one embodiment, the photoresist opening defining the scribe line may have a width of about 8 microns. Thereafter, a dielectric etch (e.g., dry etch) is performed on the passivation layer 224 and the isolation dielectric 220 within the scribe line through the opening of the photoresist layer 226 to form the scribe line trench 228. A silicon etch is performed to continue the trench 228 into the substrate 210. For example, a dry etching process with etchant $CF_4$, $C_3F_8$, $C_4F_8$, $CHF_3$, and/or $CH_2F_2$ is implemented to etch silicon oxide. For another example, a dry etching process with etchant HBr, $Cl_2$, $SF_6$, and/or $O_2$ is implemented to etch the silicon substrate. In another example, with silicon nitride being used in the passivation layer, a silicon nitride etch may be implemented in a separate etching process using an etchant effective to remove the silicon nitride as known in the art. In another example, when silicide is used, an etchant effective to remove the silicide formed on the doped silicon routing feature may be utilized. In one embodiment, the scribe line trench 228 has a depth ranging between about 100 microns and about 250 microns. In another embodiment, the scribe line trench 228 has a depth of about 175 microns. As illustrated in FIG. 3, after the implementation of the etching to form the scribe line trench, the photoresist layer is removed by a suitable process such as wet stripping or plasma ashing. It is understood that the formation of the scribe line trench can be accomplished through various techniques well known in the art.

Because the metallization within the scribe line region 210c is free of metal interconnect features, and because any interconnection across the scribe line is realized by a doped routing feature formed in the silicon substrate, the etching process of forming the scribe line trench eliminates concerns arising from metal etching, such as copper etching, and substantially reduces the damage to the seal ring caused by the metal etching.

In FIG. 3, a backside of the substrate 210 is then ground down to at least reach the bottom side of the scribe trench 228 so that the various IC dies are separated from each other to achieve the singularization of dies (chips). In one example, the silicon substrate 210 has a thickness of about 750 microns. The final thickness of the singularized dies, after forming the metallization on the front side and grinding from the backside of the substrate, is about 175 microns.

The present embodiment provides several benefits. The overall scribe line area is reduced due to less footprints in trench etching relative to die sawing (for example, die sawing can have scribe lines with widths of about 60 microns or larger). Also, the manufacturing process is simplified with less processing complexity and higher processing efficiency. The reliability of the IC dies is improved (e.g., reduced damage to the seal rings).

The present disclosure provides an IC device and the method of making the same. Although various embodiments are provided, other variations in this spirit and scope are considered as consistent with the present disclosure and are suggestive. For example, the doped routing feature 212 in the scribe line region 210a may be formed by a suitable diffusion process. In another example, the conductive routing feature in the scribe line may be reduced to only include silicide feature 218 for electrical connection, eliminating the underlying doped silicon feature. In another embodiment, the doped region 214 is formed in one device cell area 210a, but the doped region 216 is part of a test circuit (test vehicle) formed in the open region between the scribe line trench and the seal ring. In this case, the substrate region 210b with the doped region 216 and the overlying interconnect is within the open region between the scribe line trench and the seal ring. The method 100 may further include forming other device features, such as gate stacks including gate dielectrics and gate electrodes for CMOS transistors, memory devices, and/or image sensors.

The metal interconnect is formed on the semiconductor substrate 210 and configured to properly connect various doped regions in the substrate. In the present embodiment, the metal interconnect includes multilayer interconnect (MLI) having horizontal conductive features (metal lines) disposed at multiple metal layers and vertical conductive features, such as contacts and vias. A via is configured to connect two metal lines at different metal layers. A contact is configured to connect a metal line and the substrate. The copper interconnect may be used. In one embodiment, the copper interconnect may include copper, copper alloy, titanium, titanium nitride, tantalum, tantalum nitride, tungsten, polysilicon, metal silicide, or combinations thereof. The copper interconnect may be formed by techniques such as CVD, sputtering, plating, or other suitable processes. The silicide may be used for contacts and other conductive features. The silicide used in multilayer interconnects may include nickel silicide, cobalt silicide, tungsten silicide, tantalum silicide, titanium silicide, platinum silicide, erbium silicide, palladium silicide, or combinations thereof.

The isolation dielectric is disposed in the interconnect structure to isolate the various conductive features. The isolation dielectric includes an interlayer dielectric (ILD) disposed between the substrate and the first metal layer. The isolation dielectric also includes inter-metal dielectric (IMD) disposed between adjacent metal layers. The isolation dielectric includes a dielectric material such as silicon oxide, silicon nitride, silicon oxynitride, or spin-on glass (SOG). The dielectric material alternatively includes a material of a low dielectric constant (low k), such as a dielectric constant less than about 3.5. In various examples, the dielectric material may include silicon dioxide, silicon nitride, silicon oxynitride, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The isolation dielectric is formed by a technique including spin-on coating, CVD, or other suitable processes.

The semiconductor substrate 210 may include an epitaxial layer. For example, the substrate may have an epitaxial layer overlying a bulk semiconductor. Further, the substrate may be strained for performance enhancement. For another example, the epitaxial layer may include semiconductor materials different from those of the bulk semiconductor, such as a layer of silicon germanium overlying a bulk silicon or a layer of silicon overlying a bulk silicon germanium.

In another example, the passivation layer includes silicon oxide formed by chemical vapor deposition (CVD) using TEOS (tetra-ethyl-ortho-silicate or equivalently tetra-ethoxy-silane). In another embodiment, the passivation layer includes a silicon nitride (SiN) film formed by a CVD process. In furtherance of this embodiment, the CVD process to form the SiN layer includes precursors Hexachlorodisilane ($Si_2Cl_6$), Dichlorosilane ($SiH_2Cl_2$), Bis(TertiaryButylAmino)Silane ($C_8H_{22}N_2Si$), and Disilane ($Si_2H_6$).

Thus, the present disclosure provides a method of making an integrated circuit (IC) device. The method includes forming a first IC feature and a second IC feature in a semiconductor substrate, the first and second IC features being spaced from each other and separated by a scribe region; forming, in the semiconductor substrate, a doped routing feature at least partially within the scribe region and configured to connect the first and second IC features; forming a multilayer interconnect (MLI) structure and an interlayer dielectric (ILD) on the semiconductor substrate, wherein the MLI is configured to be absent within the scribe region; and etching the ILD and the semiconductor substrate within the scribe region to form a scribe-line trench.

In one embodiment, the method further includes a grinding process to reduce the semiconductor substrate from a backside. In other embodiments, the etching of ILD and the semiconductor substrate may include etching silicon oxide and silicon. The etching of ILD and the semiconductor substrate may include implementing a dry etch. The forming of the doped routing feature may include performing a boron ion implantation with an implantation energy ranging between about 10 keV and 100 keV, and an implantation dose ranging between about $10^{13}/cm^3$ and about $10^{17}/cm^3$. The forming of the doped routing feature may include performing a phosphorus ion implantation with an implantation energy ranging between about 20 keV and 200 keV, and an implantation dose ranging between about $10^{13}/cm^3$ and about $10^{17}/cm^3$.

The present disclosure also provides another embodiment of a method of making an integrated circuit (IC) device. The method includes forming a plurality of devices on a silicon substrate, wherein the devices are separated from each other by scribe regions; forming a multilayer interconnect (MLI) structure and an interlayer dielectric (ILD) on the silicon substrate, the MLI structure configured to be free of the scribe region; and forming a doped silicon feature on the silicon substrate for any electrical connection within the scribe regions; and etching the ILD and the semiconductor substrate to form a scribe trench.

In various embodiments of the disclosed method, the method may further include a grinding process to reduce the semiconductor substrate from a backside. The method may further include forming a silicide on the doped silicon feature. The etching of the ILD and the semiconductor substrate may include implementing a dry etch. The forming of the doped routing feature may include performing a boron ion implantation with an implantation energy ranging between about 10 keV and 100 keV, and an implantation dose ranging between about $10^{13}/cm^3$ and about $10^{17}/cm^3$. The forming of the doped routing feature may include performing a phosphorus ion implantation with an implantation energy ranging between about 20 keV and 200 keV, and an implantation dose ranging between about $10^{13}/cm^3$ and about $10^{17}/cm^3$.

The present disclosure also provides an integrated circuit (IC) chip. The IC chip includes a semiconductor substrate having a scribe sidewall substantially perpendicular to the semiconductor substrate and free of metal interconnect structure; a circuit device formed in the semiconductor substrate; and a conductive feature formed in the semiconductor substrate and exposed from the scribe sidewall, wherein the conductive feature includes at least one of doped silicon and silicide.

In one embodiment, the IC chip further includes metal interconnect formed on the semiconductor substrate, configured to connect various features of the circuit device. In other embodiments, the IC chip further includes a doped region in the semiconductor substrate, the doped region in contact with the conductive feature. The doped region may be a portion of a test vehicle. The doped region may be in contact with the circuit device. The IC chip may further include a seal ring interposed between the doped region and the circuit device. The IC chip may further include a seal ring overlying a portion of the conductive feature. The semiconductor substrate includes silicon.

Although embodiments of the present disclosure have been described in detail, those skilled in the art should understand that they may make various changes, substitutions, and alterations herein without departing from the spirit and scope of the present disclosure. Accordingly, all such changes, substitutions, and alterations are intended to be included within the scope of the present disclosure as defined in the following claims. In the claims, means-plus-function clauses are intended to cover the structures described herein as performing the recited function and not only structural equivalents, but also equivalent structures.

What is claimed is:

1. A method of making an integrated circuit (IC) device, comprising:
   forming a first IC feature and a second IC feature in a semiconductor substrate, the first and second IC features being spaced from each other and separated by a scribe region;
   forming, in the semiconductor substrate, a doped routing feature at least partially within the scribe region and configured to connect the first and second IC features;
   forming a multilayer interconnect (MLI) structure and an interlayer dielectric (ILD) on the semiconductor substrate, wherein the MLI is configured to be absent within the scribe region; and
   etching the ILD and the semiconductor substrate within the scribe region to form a scribe-line trench.

2. The method of claim 1, further comprising a grinding process to reduce the semiconductor substrate from a backside of the semiconductor substrate.

3. The method of claim 1, wherein the etching of ILD and the semiconductor substrate comprises etching silicon oxide and silicon.

4. The method of claim 1, wherein the etching of ILD and the semiconductor substrate comprises implementing a dry etch.

5. The method of claim 1, wherein the forming of the doped routing feature comprises performing a boron ion implantation with an implantation energy ranging between about 10 keV and 100 keV, and an implantation dose ranging between about 1013/cm3 and about 1017/cm3.

6. The method of claim 1, wherein the forming of the doped routing feature comprises performing a phosphorus ion implantation with an implantation energy ranging between about 20 keV and 200 keV, and an implantation dose ranging between about 1013/cm3 and about 1017/cm3.

7. A method of making an integrated circuit (IC) device, comprising:
   forming a plurality of devices on a silicon substrate, wherein the devices are separated from each other by scribe regions;
   forming a multilayer interconnect (MLI) structure and an interlayer dielectric (ILD) on the silicon substrate, the MLI structure configured to be absent within the scribe region; and
   forming a doped silicon feature within the scribe regions and on the silicon substrate for electrical connection; and
   etching the ILD and the silicon substrate to form a a scribe trench.

8. The method of claim 7, further comprising a grinding process to reduce the semiconductor substrate from a backside of the silicon substrate.

9. The method of claim 7, further comprising forming a silicide on the doped silicon feature.

10. The method of claim 7, wherein the etching of the ILD and the semiconductor substrate comprises a dry etch.

11. The method of claim 7, wherein the forming of the doped routing feature comprises performing a boron ion implantation with an implantation energy ranging between about 10 keV and 100 keV.

12. The method of claim 7, wherein the forming of the doped routing feature comprises performing a phosphorus ion implantation with an implantation energy ranging between about 20 keV and 200 keV.

13. A method comprising:
   providing a semiconductor substrate having two dies separated by a scribe line;
   forming one or more doped silicon routing features in the scribe line;
   forming a metal interconnect in each of the two dies;
   forming an isolation layer in the two dies and the scribe line; and
   interconnecting the two dies by a combination of the doped silicon routing feature, the metal interconnects, and the isolation layer;
   wherein the metal interconnects are not positioned in the scribe line.

14. The method of claim 13 further comprising:
   forming a passivation layer over the metal interconnect.

15. The method of claim 13 further comprising:
   forming a silicide layer on the doped silicon routing features using a self-aligned silicide (salicide) process.

16. The method of claim 13 further comprising:
   forming a scribe ring around the two dies.

17. The method of claim 16 further comprising:
   etching the isolation layer and the semiconductor substrate to form a scribe line trench; and
   grinding a backside of the semiconductor substrate to at least reach a bottom side of the scribe trench, thereby separating the two dies from each other.

18. The method of claim 17 wherein the etching is a non-metal etch.

* * * * *